United States Patent [19]
DeVolk

[11] Patent Number: 5,405,572
[45] Date of Patent: Apr. 11, 1995

[54] REDUCTION OF OXIDES FROM METAL POWDERS WHEREIN THE DE-OXIDIZED POWDER IS READY TO BE APPLIED IN ITS DE-OXIDIZED STATE DIRECTLY FROM THE FURNACE FOR FUSING TO A SUBSTRATE

[75] Inventor: Gerald A. DeVolk, Albuquerque, N. Mex.

[73] Assignee: Printron, Inc., Albuquerque, N. Mex.

[21] Appl. No.: 853,389

[22] Filed: Mar. 18, 1992
(Under 37 CFR 1.47)

[51] Int. Cl.$^6$ ................................................ B22F 7/00
[52] U.S. Cl. .......................................... 419/9; 419/23; 419/58; 75/369
[58] Field of Search .............. 148/513; 419/31, 5, 419/8, 9, 23, 58; 75/369

[56] References Cited

U.S. PATENT DOCUMENTS

| | | | |
|---|---|---|---|
| 4,772,488 | 9/1988 | Pinch et al. | 427/38 |
| 4,871,608 | 10/1989 | Kondo et al. | 428/209 |
| 4,877,555 | 10/1989 | Yuhaku et al. | 252/512 |
| 4,880,567 | 11/1989 | Prabhu et al. | 252/512 |
| 4,891,246 | 1/1990 | McEwen et al. | 427/229 |
| 4,937,016 | 6/1990 | Suehiro et al. | 252/512 |
| 5,014,420 | 5/1991 | Howard et al. | 29/846 |

OTHER PUBLICATIONS

*Copper Base Powder Metallurgy*, Metal Powder Industries Federation, New Jersey, 1980, pp. 14-19.

Primary Examiner—Donald P. Walsh
Assistant Examiner—Anthony R. Chi
Attorney, Agent, or Firm—Lowe, Price, LeBlanc & Becker

[57] ABSTRACT

A method for the reduction of oxides in a powder metal requires a predetermined quantity of powder to be loaded into a retort tube or other type of furnace which is pumped down to a vacuum less than about $5 \times 10^{-6}$ Torr. The retort is ramped up to a temperature of about 500°-750° C. and maintained at that temperature under high vacuum for about 30-60 minutes to obtain reduction of oxides and de-gasing of copper powders of screen mesh sizes of $-100$. A hydrogen partial pressure of 150 microns to 20 mm of Hg may be valved into the system from standard grade hydrogen gas 15 minutes into approximately the 30-60 minute hold temperature ramp and then valved off on cooling to 400° C. to improve oxide removal. The system is returned to the high vacuum mode and furnace cooled to room temperature.

20 Claims, 2 Drawing Sheets

REDUCTION OF OXIDES FROM METAL POWDERS WHEREIN THE DE-OXIDIZED POWDER IS READY TO BE APPLIED IN ITS DE-OXIDIZED STATE DIRECTLY FROM THE FURNACE FOR FUSING TO A SUBSTRATE

TECHNICAL FIELD

The present invention relates generally to systems for removing surface oxides from metal powders and, more particularly, to an improved method of reducing surface oxides from copper metal and metal alloy powders to be used as wet conductive inks or pastes or as dry powders, particularly those based on copper conductors, in the manufacture of printed circuits.

BACKGROUND ART

Conductive materials have been developed by the assignee of the present invention for various applications such as the screening of such materials as powders, inks or pastes onto substrates and subsequent fusing under controlled conditions to form electrically conductive paths.

Of the conductive metals, copper is one of the more attractive because it has better conductivity than gold but is considerably cheaper. One of the major problems encountered in the fabrication of conductive lines on substrates using copper powder or an alloy powder consisting of a copper powder and other alloy metal powders, or viscous ink or paste containing the copper powder, is that commercially available copper powders have varying degrees of surface oxides which adversely effects the conductivity of the copper conductors. In fact, the copper oxide layer on the surface has a melting temperature as much as 157° C. higher than the pure metal, in accordance with the Cu-O phase diagram. Disadvantageously, this oxide layer must be broken down before complete fusing or melting can occur and therefore less control over the final quality of the melted conductive material and possible loss of electrical conductivity in the conductors can result. To my knowledge, there is no system of which I am aware for removing metal oxides from metal powders used in the manufacture of electrical conductor inks or powders.

It is accordingly one object of the present invention to remove oxides from metal powders to enable the powders to be applied wet or dry, quickly heated and fused to a substrate.

Another object is to remove metal oxides from copper powders to lower the temperature at which the powders will fuse together and bond to a substrate.

Yet another object is to obtain more precise control over the melting point of the powder material.

SUMMARY OF THE INVENTION

A method for reducing surface oxides of a metal powder for use as a fused, electrically conductive path, comprises the steps of placing a quantity of the metal powder in a furnace and creating a vacuum by pumping down to a predetermined pressure. The powder in the evacuated furnace is then heated to a predetermined temperature for a predetermined time interval to remove the surface oxides and obtain a de-oxidized powder which may be applied directly to a substrate or mixed with binders to form conductor inks or pastes.

The metal powder being treated is preferably pure copper material having a screen mesh of $-100$. The furnace is preferably pumped down to a predetermined vacuum pressure of about $5 \times 10^{-6}$ Torr then heated to a predetermined temperature of about 500°–750° C. for copper powder for a predetermined time interval of at least about 30 minutes.

A reducing gas may be introduced into the furnace to further assist in the removal of surface oxides from the powder. Preferably, the reducing gas is hydrogen which is valved into the furnace at a partial pressure of 150 microns to 20 mm of Hg. The valving of the hydrogen gas occurs approximately 15 minutes into the predetermined time interval of 30 minutes.

The powder which is being de-oxidized is a commerically available copper or other metal powder which is placed in the furnace as a dry bulk material containing no organics or other vehicles. After treatment, the resulting de-oxidized powder is ready to be applied in its de-oxidized state to a substrate for fusing thereon, or for mixing with binders to form a conductor paste.

In accordance with another feature of the invention, the reducing system used in this invention includes a vacuum system having a rough vacuum side and a high vacuum side connected in parallel to each other through a vacuum manifold connected to the outlet of the vacuum furnace. Preferably, vacuum is initially drawn in the furnace by means of a mechanical pump in the rough vacuum side. Once the vacuum has been drawn or "roughed" down to a pressure which is greater than the predetermined pressure, the rough vacuum side is isolated and the high vacuum side communicates with the furnace through the manifold to draw the vacuum down to the predetermined pressure. The high vacuum side features a diffusion or other high vacuum pump connected to the furnace through a vacuum ballast which is maintained at a predetermined low pressure level by the high vacuum pump.

When hydrogen gas is used as reducing agent, the high vacuum side is isolated from the furnace after achieving the predetermined vacuum pressure and low vacuum is then maintained by the rough vacuum side through which the hydrogen gas is vented from the system.

In accordance with other features of this invention, copper filament material may be disposed in the upstream and downstream ends of the furnace with the powder material being de-oxidized positioned therebetween. The copper filament is preferably a copper wool and the upstream filament acts as a getter to remove oxygen and water vapor impurities from the hydrogen gas entering the furnace through the upstream end. Both the upstream and downstream pads of copper filament material also disrupt gas flow in the furnace to prevent transport of the powder from the furnace into the system.

In accordance with another feature of this invention, an oxygen/$H_2O$ getter is positioned upstream from a metering valve through which the hydrogen gas is fed to the furnace. The getter includes a cylindrical tube which is densely packed with copper filament or wool within a uniform "working hot zone" which is defined as a zone of uniform temperature along the zone length. The zone is heated and maintained at a temperature of about 700° F. plus or minus 25° F. which has been discovered to be an optimum working temperature for extracting oxygen and moisture from the hydrogen gas stream.

Still other objects and advantages of the present invention will become readily apparent to those skilled in this art from the following detailed description, wherein only the preferred embodiments of the invention are shown and described, simply by way of illustration of the best mode contemplated of carrying out the invention. As will be realized, the invention is capable of other and different embodiments, and its several details are capable of modifications in various obvious respects, all without departing from the invention. Accordingly, the drawing and description are to be regarded as illustrative in nature, and not as restrictive.

BEST MODE FOR CARRYING OUT THE INVENTION

Figure 1:
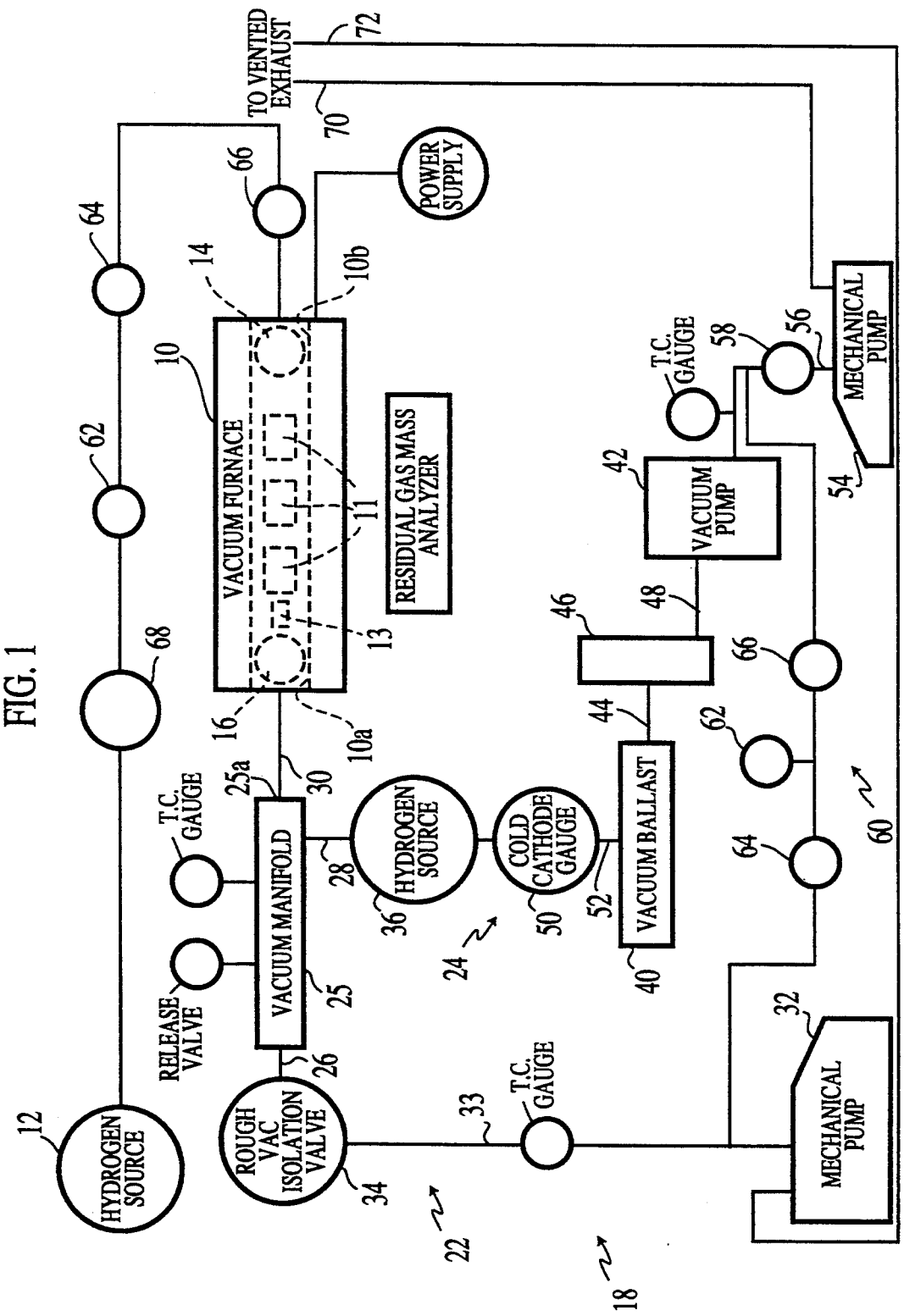
FIG. 1 is a process diagram of the metal oxide reducing system in accordance with the present invention.

FIG. 1 is a schematic layout of a system for deoxidizing or reducing metal oxides from a metal powder ( or metal shavings, chips, shot or solid geometric surfaces of metal alloys) by processing the powder in a vacuum or hydrogen partial pressure chamber to remove surface oxides and to de-gas the powder. A preferred use of the deoxidized powder is as a "printing ink" wherein the powders or viscous ink compositions thereof are screened on ceramic or polymer substrates and heated to be fused into conductive circuit paths. The power required to heat the powder to at least a partial melt can vary significantly as a function of the degree of oxidation. When forming printed circuit boards, good control over the melting temperature of the metal powder material is important to ensure an even melt of the powder to provide continuous solid conductive paths. By de-oxidizing the commercially available powders in accordance with the present invention the melting point of the de-oxidized powder approaches the melting temperature of the metal in a pure, unoxidized state. This process thereby also reduces the power requirements necessary to melt the powder (in a dry or viscous ink form) during circuit board production and minimizes warpage of certain substrates as well as damage to semiconductor components that may be simultaneously or previously provided to the boards. The copper powders being treated are therefore preferably applied as traces to the substrate, either as a dry metallic powder or viscous ink or paste containing the de-oxidized metallic particles. The copper powder consists of pure copper particles having one or a combination of different particle sizes. The copper particles are generally pure copper. Other types of pure metal particles or compositions of different metal particles subjected to oxidation may be treated with this invention.

A predetermined, weighed amount of the oxidized copper powder is placed within one or more boats 11, such as glazed alumina ceramic boats which are well known, and these boats are loaded into a tube retort 10 as depicted in FIG. 1. The tube retort 10 is also well known and may be made of almost pure hard dense alumina. After placing the boats 11 in the retort 10, a test coupon (e.g., 300 Series stainless steel foil) 13 is inserted into the tube retort through the downstream end 10a so as to be located immediately downstream adjacent the boats. This test coupon 13 will serve as an indicator whether the reduction process of the invention has worked correctly, i.e., for complete reduction to occur, the test coupon must come out of the retort in a bright, shiny and clean condition. If the coupon 13 is discolored, this is an indication that complete oxide reduction has not occurred.

Next, copper filament material 14,16 is loaded into both the upstream end 10b as well as the downstream end 10a of tube retort 10 to purify the hydrogen gas stream from hydrogen source 12, described hereinafter, and to inhibit the transport of metal powder from the boats 11 upon the separate introduction of vacuum and hydrogen gas into the vacuum furnace 10 as also described hereinafter. These copper filaments 14,16 are in the form of a copper wool and a sufficient quantity is provided to fill the inlet and outlet openings 10b,10a of the furnace retort 10.

As mentioned above, the feature of providing the copper filament material 14,16 at both upstream and downstream ends 10b,10a of the retort is two-fold. One purpose is to purify the hydrogen gas stream by acting as a getter for moisture and oxygen, particularly when a standard welding grade bottled hydrogen gas is used as source 12. Thus, the upstream filament material 14 particularly acts as a getter for these impurities in the gas stream. The second purpose of the materials 14,16 is to inhibit the transport of metal powder materials from the boats 11 upon the separate start-up and introduction of vacuum and gas into the retort 10 in the manner described below. Thus, the upstream filaments 14 also act as a baffle that promotes laminar flow of hydrogen gas entering retort 10 through inlet 10b. The downstream filaments 16 perform a similar baffle function as air or hydrogen gas is pumped out through the retort by the vacuum system 18.

After loading retort 10 in the manner described above and prior to heating, the air is pumped out of the retort through vacuum system 18 having a rough vacuum side 22 and a high vacuum side 24 each connected to a vacuum manifold 25 through a line 26 and 28, respectively. The vacuum manifold 25 is in turn connected at its inlet 25a to the outlet 10a of retort tube 10 through a line 30. The atmosphere in tube 10 is initially roughed down to approximately 1–5 microns of Hg pressure (at standard temperature) through a known mechanically driven pump 32 connected to the vacuum manifold 25 through an inlet line 33 and a rough vacuum side isolation valve 34 to which line 26 is connected to the inlet thereof.

Once the rough vacuum side 22 has pumped the retort interior down to about 1 to 5 microns of Hg pressure, valve 34 is closed to isolate the retort interior from the rough vacuum side. A high vacuum side isolation valve 36 is then opened to communicate the retort interior to the high vacuum side through line 30, vacuum manifold 25, and line 28. This high vacuum side 24 features a pressure vessel in the form of a vacuum ballast 40 which is maintained at a predetermined high vacuum level with a diffusion pump or other high vacuum pump 42 connected to the ballast outlet through a line 44, liquid/nitrogen trap 46, and a line 48, respectively. High vacuum pressure conditions within the retort 10 are monitored with a cold cathode gauge 50 connected to the inlet line 52 communicating the vacuum ballast 40 to the high vacuum isolation valve 36.

In this system, the liquid/nitrogen trap 46 serves to remove water vapor from the system and also protects the process chamber in retort tube 10 from the possible backstreaming of hydrocarbons from a second mechanical pump 54 which is a backup pump to diffusion pump 42. (High vacuum pumping by cryogenic or turbomolecular means would not require trap 46). This pump 54 is connected to the outlet of diffusion pump 42 through an inlet line 56 which is valved at 58. Upstream from valve 58 and downstream from diffusion pump 42 the inlet line 56 is interconnected with a line 60 to the inlet line 33 of mechanical pump 32 on the rough vacuum side 22. This line 60 may have a release valve and diagnostic inlet 62 which is separately valved to inlet lines 33 and 56 through valves 64 and 66, respectively. Suitable opening and closing of valves 64,66 enables separate depressurization of one or both of the rough or high vacuum sides 22,24 of the system, or diagnostic testing, or use of either mechanical pump 32 or 54 as backups for each other.

After attaining a final vacuum condition within tube retort 10 of about $5 \times 10^{-6}$ Torr with the high vacuum side 24 of the vacuum system, the furnace is conventionally heated to a predetermined temperature threshold of approximately 500°-750° C. where the temperature is maintained for at least about 30-60 minutes and preferably 30 minutes. If hydrogen gas is not used as a reducing gas, high to ultra high vacuum may be continuously maintained with the high vacuum side 24 of the vacuum system, whereby gaseous byproducts of the surface oxides are discharged from the system through an exhaust line 70 connected to the outlet of mechanical pump 54.

If hydrogen is to be introduced into retort 10 as a reducing agent, high vacuum valve 36 is closed (to isolate diffusion pump 42 from hydrogen) with the vacuum now being maintained through the rough vacuum side 22. An inlet valve 62 which communicates hydrogen source 12 with retort 10 through a one way check valve 64 and metering valve 66 interposed therebetween, is open. The hydrogen gas then passes from source 12 through a two-stage pressure regulator 68 (which is used to reduce the hydrogen source pressure from a bottle pressure of about 2,400 psi to about 4 psi) where it is introduced into the inlet side 10b of the retort 10. The upstream getter 14 diffuses the hydrogen gas to prevent powder transport and, at a temperature of at least about 700° F., serves to remove oxygen and water vapor from the incoming hydrogen gas stream along with oxygen and moisture getter 73.

Figure 2:
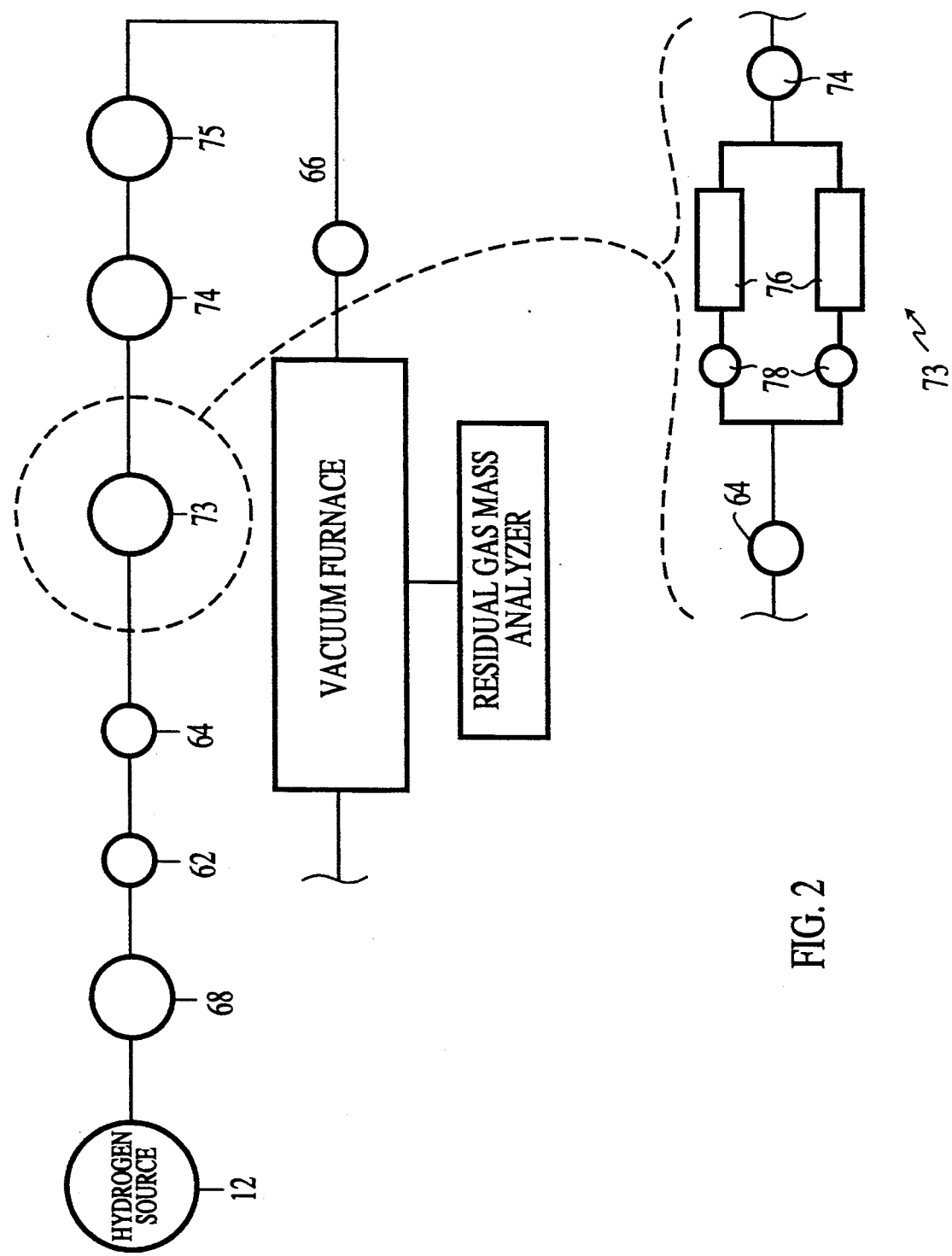
FIG. 2 is a process diagram depicting a further aspect of this invention.

The getter 73, with reference to FIG. 2, preferably comprises a pair of cylindrical tubes 76 connected in parallel to each other to the check valve 64 through the metering valve 66. Each getter tube is separately valved to the check valve 64 as at 78 and the downstream ends of each tube are connected to the inlet of oxygen analyzer 74. Each tube 76 is densely packed with copper filament or wool within a uniform "working hot zone" which zone is defined as a zone of uniform temperature along its length. As a result of extensive experimentation, it has been discovered that it is this zone which is preferably maintained at a temperature about 700° F. plus or minus 25° F. which has been discovered to be an optimum working temperature for extracting oxygen and moisture from the hydrogen gas stream entering one of the getter tubes 76.

With one of the getter tubes on-line by closure of the inlet valve 78 of the other getter tube, the hydrogen gas is purified by the on-line getter tube and then passes through oxygen analyzer 74 and moisture monitor 75 which may be conventional structures, to the metering valve 66. When either analyzer 74 or monitor 75 respectively detect an oxygen or a moisture pressure in excess of 1 ppm, an alarm is triggered so that the "on-line" tube 76 may be valved shut and the other tube containing fresh copper filament or wool valved on-line to continue the oxygen and moisture removal process from the hydrogen stream. The hydrogen gas, in combination with low vacuum and high temperature as aforesaid, de-oxidizes the powder and the constituents pass out of the system through vacuum manifold 25, rough vacuum isolation valve 34, and mechanical pump 32 when hydrogen is used in the de-oxidizing process.

When hydrogen is used, a hydrogen vacuum partial pressure of 150 microns to 20 mm Hg is desirable.

As a result of experimentation, excellent de-oxidizing results of pure copper powder were obtained without the introduction of hydrogen gas by heating and maintaining the retort at a temperature of about 600° C.-700° C. for approximately 30 minutes with vacuum pressure within the retort about $5 \times 10^{-6}$ Torr. Under these conditions, the test coupon emerged in a bright and clean state and the powder changed from a black to dark brown color (indicating a heavily oxidized condition) to a light clean copper color. The use of hydrogen gas as a reducing agent resulted in excellent de-oxidation at lower retort temperatures of about 500° C. at plus or minus 15° C. for 30/60 minutes.

It will be readily seen by one of ordinary skill in the art that the present invention fulfills all of the objects set forth above. After reading the foregoing specification, one of ordinary skill will be able to effect various changes, substitutions of equivalents and various other aspects of the invention as broadly disclosed herein. It is therefore intended that the protection granted hereon be limited only by the definition contained in the appended claims and equivalents thereof.

I claim:

1. A method for reducing surfaces oxides of a metal powder, comprising the steps of:
    (a) placing a quantity of said metal powder in a furnace;
    (b) creating a vacuum in said furnace by pumping down to a predetermined pressure;
    (c) heating the powder in the furnace to a predetermined temperature for a predetermined time interval to remove said surface oxides and obtain a dry, de-oxidized powder; and
    (d) placing the de-oxidized powder directly on a substrate for forming at least one fused, electrically conductive path.

2. The method of claim 1, wherein the metal powder is one of pure copper material, copper/silver, copper/tin alloys or other alloys.

3. The method of claim 2, wherein the metal powder has a screen mesh size of $-100$.

4. The method of claim 1, wherein the furnace is pumped down to a predetermined vacuum pressure of approximately $5 \times 10^{-6}$ Torr.

5. The method of claim 2, wherein the furnace is pumped down to a predetermined vacuum pressure of approximately $5 \times 10^{-6}$ Torr.

6. The method of claim 1, wherein said predetermined temperature is about 500° C.-750° C. for a pure copper powder.

7. The method of claim 6, wherein said predetermined time interval is approximately 30-60 minutes.

8. The method of claim 1, comprising the further step of introducing a reducing gas into the furnace to further assist in removal of surface oxides from the powder.

9. The method of claim 8, wherein the reducing gas is hydrogen gas.

10. The method of claim 9, wherein the hydrogen gas is valved into the furnace sustaining a partial pressure of 150 microns to about 20 mm Hg.

11. The method of claim 10, wherein the valving of hydrogen gas occurs approximately 15 minutes into a predetermined time interval of 30–60 minutes.

12. The method of claim 1, wherein the powder is placed in the furnace as a dry bulk material containing no organics or other vehicles.

13. A method for reducing surfaces oxides of a metal powder for use as a fused, electrically conductive path, comprising the steps of:
   (a) placing a quantity of said metal powder in a furnace;
   (b) creating a vacuum in said furnace by pumping down to a predetermined pressure; and
   (c) heating the powder in the furnace to a predetermined temperature for a predetermined time interval to remove said surface oxides and obtain a dry, de-oxidized powder, wherein the powder is placed in the furnace as a dry bulk material containing no organics or other vehicles, wherein the de-oxidized powder is ready to be applied in its de-oxidized state directly from the furnace for fusing to a substrate, or contained in a conditioned inert gas back-filled container for storage.

14. A method for reducing surfaces oxides of a metal powder for use as a fused, electrically conductive path, comprising the steps of:
   (a) placing a quantity of said metal powder in a furnace;
   (b) creating a vacuum in said furnace by pumping down to a predetermined pressure; and
   (c) heating the powder in the furnace to a predetermined temperature for a predetermined time interval to remove said surface oxides and obtain a dry, deoxidized powder, wherein the vacuum is created in the furnace through (1) a rough vacuum side of a vacuum system, the rough vacuum side including a mechanical pump connected to the furnace through a vacuum manifold for pumping and removing air from the furnace down to a pressure which is greater than the predetermined pressure, and (2) a high vacuum side of the vacuum system, the vacuum system including a diffusion or other high vacuum pumps, i.e., cryogenic or turbomolecular pumps connected to the furnace through the vacuum manifold through, serially and successively, a high vacuum isolation valve, a vacuum ballast and a liquid/nitrogen trap, said high vacuum side serving to bring the vacuum down to the predetermined pressure after the vacuum in the furnace is lowered to said certain pressure by the rough vacuum side.

15. The method of claim 14, wherein, when a hydrogen gas is to be introduced into the furnace as a reducing gas, the high vacuum side of the system is closed to the furnace by closure of the high vacuum isolation valve and the hydrogen gas stream passes through the furnace and is vented from the system through the rough vacuum side.

16. The method of claim 8 or 15, comprising the further step of disposing a copper filament material at the inlet and outlet ends of the furnace so that the hydrogen gas initially passes through the upstream copper filaments upon entering the furnace so that the gas stream is purified by removal of moisture and oxygen by the copper filaments, assisted by a further oxygen and moisture getter upstream of the metering valve.

17. The method of claim 16, wherein the upstream and downstream copper filaments further serve to prevent the transport of the metal powder from the furnace by the gas stream flowing through the furnace.

18. The method of claim 17, wherein the hydrogen is supplied from a container of pressurized standard welding grade gas, and comprising the further step of introducing this gas into the furnace through a two-stage pressure regulator which lowers the pressure from about 2,400 psi to about 4 psi.

19. The method of claim 16, wherein the copper filaments remove a sufficient quantity of oxygen from the hydrogen gas so that the amount of oxygen entering the furnace is less than or equal to about one part per million (ppm).

20. The method of claim 19, wherein the copper filaments remove moisture from the incoming hydrogen gas stream so that the dewpoint is less than about $-100°$ F.

* * * * *